(12) United States Patent
Suzuki et al.

(10) Patent No.: US 12,501,220 B2
(45) Date of Patent: Dec. 16, 2025

(54) SPEAKER AND METHOD OF PRODUCING THE SAME

(71) Applicant: Foster Electric Company, Limited, Tokyo (JP)

(72) Inventors: Eiichiro Suzuki, Tokyo (JP); Yusuke Yoshizawa, Tokyo (JP)

(73) Assignee: Foster Electric Company, Limited, Tokyo (JP)

( * ) Notice: Subject to any disclaimer, the term of this patent is extended or adjusted under 35 U.S.C. 154(b) by 265 days.

(21) Appl. No.: 18/252,203

(22) PCT Filed: Sep. 24, 2021

(86) PCT No.: PCT/JP2021/035068
§ 371 (c)(1),
(2) Date: May 9, 2023

(87) PCT Pub. No.: WO2022/102260
PCT Pub. Date: May 19, 2022

(65) Prior Publication Data
US 2023/0421960 A1    Dec. 28, 2023

(30) Foreign Application Priority Data
Nov. 11, 2020 (JP) ................. 2020-187669

(51) Int. Cl.
*H04R 7/20* (2006.01)
*H04R 31/00* (2006.01)

(52) U.S. Cl.
CPC ............. *H04R 7/20* (2013.01); *H04R 31/003* (2013.01); *H04R 2231/003* (2013.01);
(Continued)

(58) Field of Classification Search
CPC .. H04R 7/20; H04R 31/003; H04R 2231/003; H04R 2307/204; H04R 2400/11;
(Continued)

(56) References Cited

U.S. PATENT DOCUMENTS

| 2005/0111689 A1* | 5/2005 | True | H04R 31/006 381/423 |
| 2015/0156590 A1* | 6/2015 | Kono | H04R 9/04 381/398 |
| 2019/0308373 A1 | 10/2019 | Shi | |

FOREIGN PATENT DOCUMENTS

| CN | 203761580 | 8/2014 |
| CN | 207427459 U * | 5/2018 |

(Continued)

OTHER PUBLICATIONS

English machine translation of CN-207427459-U (Zhang, Feng; Electro-acoustic converter's casing, monomer and module and electronic equipment; published May 2018) (Year: 2018).*

(Continued)

*Primary Examiner* — Mark Fischer
(74) *Attorney, Agent, or Firm* — Allen, Dyer, Doppelt & Gilchrist, P.A.

(57) ABSTRACT

A speaker includes: an edge having an outer circumference attached on an edge mounting portion of a resin frame by a resin ring provided on a front surface of the outer circumference. Interposed between the edge mounting portion and the resin ring is a projection-like energy director having a part abutting on one of the members and being melted from the part by ultrasonic waves.

4 Claims, 3 Drawing Sheets

(52) U.S. Cl.
CPC .... *H04R 2307/204* (2013.01); *H04R 2400/11* (2013.01); *H04R 2499/13* (2013.01)

(58) Field of Classification Search
CPC ........ H04R 2499/13; H04R 7/18; H04R 7/22; H04R 31/006; H04R 2207/021
See application file for complete search history.

(56) References Cited

FOREIGN PATENT DOCUMENTS

| | | |
|---|---|---|
| JP | S49-040929 A | 4/1974 |
| JP | S49-059628 A | 6/1974 |
| JP | S60-000198 A | 1/1985 |
| JP | S61135299 | 6/1986 |
| JP | 2005-318284 A | 11/2005 |
| JP | 2007283668 A | 11/2007 |
| WO | WO2017213201 A1 | 12/2017 |

OTHER PUBLICATIONS

Japanese Patent Office; International Search Report and Written Opinion for PCT/JP2021/035068; Oct. 26, 2021; entire document.
European Patent Office, European Search Report mailed Feb. 20, 2024, 8 pages.
Japanese Patent Office Action; Apr. 15, 2025.

* cited by examiner

SPEAKER AND METHOD OF PRODUCING THE SAME

CROSS-REFERENCE TO RELATED APPLICATIONS

This application is the § 371 National Stage Entry of International Application No. PCT/JP2021/035068, filed on Sep. 24, 2021, which claims the benefit of Japanese Patent Application No. JP2020-187669, filed on Nov. 11, 2020, the contents of which applications are herein incorporated by reference in their entirety.

FIELD OF THE INVENTION

The present disclosure relates to a speaker, which is one type of acoustic device, more particularly to a speaker suitably mountable on a vehicle; and a method of manufacturing the speaker.

BACKGROUND OF THE INVENTION

The vibration system of a speaker includes a cylindrical voice coil that is vibratably provided in the magnetic field of a magnetic circuit with a damper interposed therebetween and has a voice coil wound around an outer circumference of the voice coil. The outer circumference of the front end of this voice coil is connected to the inner circumference of a diaphragm whose outer circumference is attached to a frame via an edge.

The attaching an edge to a frame has been carried out with the use of adhesive.

In recent years, however, the European market has implemented stricter regulations on volatile organic compounds in view of human health issues (e.g., odor or content of carcinogens).

In the Chinese market, the following mandatory standards (i.e., GB standards) defining the limit of volatile organic compounds and the like for passenger cars have been implemented.

Code and Name Standards: GB/T27630-2011, Guideline for Air Quality Assessment of Passenger Car enforced on Oct. 27, 2011.

This is because adhesives contain an organic solvent, such as toluene or ethyl acetate, which adversely affects human health and the use of such an adhesive is undesirable.

Accordingly, mounting an edge on a frame by ultrasonic welding has been suggested as in Japanese Unexamined Patent Publication No. S49-59628.

CITATION LIST

Patent Document

Patent Document 1: Japanese Unexamined Patent Publication No. S49-59628

SUMMARY OF THE INVENTION

According to this background art, ultrasonic welding is performed in such a way that the edge placed between a cone ring and the frame is welded together with a flat part of the outer circumference of the back of the cone ring facing the frame. Since this case employs surface contact, it takes time to cause the melting to begin. In addition, it is difficult to control the stop welding, which leads to unstable welding quality.

The present disclosure was made in view of the foregoing. It is an object of the present disclosure to provide a speaker, and a method of manufacturing the speaker, which make it possible to quickly and firmly integrate a resin frame and a resin ring together, and reliably hold an edge of the speaker.

A speaker according to an embodiment of the present disclosure includes: an edge having an outer circumference attached on an edge mounting portion of a resin frame by a resin ring provided on a front surface of the outer circumference, the edge mounting portion including an energy director having a tip portion abutting on a back surface of the resin ring and being meltable from the tip portion by ultransonic waves. The speaker may further include: an edge compressing rib being more inner than the energy director, the edge compressing rib being configured to press and put pressures on a back surface of the outer circumference of the edge.

A speaker according to another embodiment of the present disclosure includes: an edge having an outer circumference attached on an edge mounting portion of a resin frame by a resin ring provided on a front surface of the outer circumference, the resin ring including, on a back surface thereof, an energy director having a tip portion abutting on a front surface of the edge mounting portion and being meltable from the tip portion by ultrasonic waves. The speaker may further include: an edge compressing rib being more inner than the energy director, the edge compressing rib being configured to press and put pressure on a front surface of the outer circumference of the edge.

The speaker in the above embodiments may be configured such that the edge compressing rib is distanced from the energy director.

An aspect of the present disclosure is directed to a method of manufacturing a speaker, the method including placing an outer circumference of an edge between a resin frame and a resin ring, where the resin ring is on a front side with respect to the resin frame, and attaching the outer circumference of the edge by ultrasonic waves, the method including providing an energy director on an outer circumference of an edge mounting portion of the resin frame or an outer circumference of the resin ring, the energy director being configured to melt from a tip portion thereof upon receipt of energy of the ultrasonic waves on an outer circumference of an edge mounting portion of the resin frame or an outer circumference of the resin ring; and welding the resin frame and the resin ring via the energy director melted, so that the outer circumference of the edge are fixedly sandwiched between the resin frame and the resin ring. The method may further include: providing an edge compressing rib being more inner than the energy director, the edge compressing rib being configured to press and put pressure on a front surface or a back surface of the outer circumference of the edge.

According to the speaker and the method of manufacturing the speaker of the present disclosure, the resin frame and the resin ring are welded via the energy director that melts under application of the energy of ultrasonic waves, the energy director is configured to begin to melt quickly, thereby allowing fast integration of the resin frame and the resin ring with the outer circumference of the edge interposed therebetween, and making it easier to control the stop of welding via the energy director, which facilitates stable welding. With the edge compressing rib provided, the outer circumference of the edge is subject to pressure from the edge compressing rib which bites into the outer circumference of the edge to hold the edge at a predetermined position. This makes it possible to hold the edge at the predetermined position in such a way that the edge will not be displaced.

DETAILED DESCRIPTION OF PREFERRED EMBODIMENTS

Figure 1:
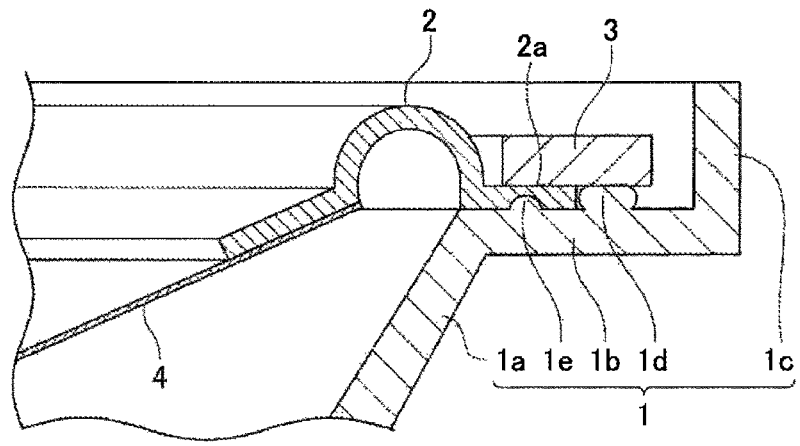
FIG. 1 is a side section view of a main part according to a first embodiment of the present invention.

FIG. 1 is a sideward cross-sectional of a main part in an assembled state according to a first embodiment of the present invention. A speaker in this embodiment is a circular speaker with a centerline a as its axis. Hereinafter, a "radial direction" represents a direction along the radius from the centerline.

In the figure, reference numeral 1 denotes a resin frame molded from a reinforced resin including a resin such as polypropylene (PP) resin, and ABS resin, or a polycarbonate (PC) resin with, for example, glass fibers (GF) added therein.

This resin frame 1 has a cone-shaped body 1a and a flange-shaped edge mounting portion 1b. In the resin frame 1, the edge mounting portion 1b is formed to expand outward radially from on a front end of an outer circumference of the body 1a.

The edge mounting portion 1b includes a rib-shaped outer wall 1c on an outer edge, the outer wall 1c rising forward.

Some of the features of this embodiment are as follows. A projection-like energy director 1d, which is meltable and deformable by ultrasonic waves, pro-jects from the outer circumference of the edge mounting portion 1b flat along a front surface, which is a sound emitting surface, of the speaker. An outer circumference 2a of the edge 2 is sandwiched and held between a resin ring 3 and the edge mounting portion 1b of the resin frame 1 with the energy director 1d interposed therebetween and having been subjected to melting. Moreover, one feature of the features of this embodiment is such that, at the same time, this configuration allows the resin frame 1 and the resin ring 3 to firmly adhere to each other via the energy director 1d. In this Description, a "back" is the opposite side with respect to the sound emitting surface of the speaker, and the front-back direction (i.e., along the centerline a, which will be described later) of the speaker is described and illustrated as the vertical direction (i.e., along the height).

The edge mounting portion 1b includes an edge compressing rib 1e positioned to be radially more inner than the energy director 1d, that is, more proximal to a diaphragm 4. The sideward cross-section of the edge compressing rib 1e is a substantially semi-circular shape with a shorter height (i.e., length from the front surface of the edge mounting portion 1b to the tip portion of the edge compressing rib 1e) than the energy director 1d. Furthermore, the height of the edge compressing rib 1e, not high enough to penetrate the outer circumference 2a of the edge 2, allows firm holding of the edge 2. To avoid penetration into the outer circumference 2a of the edge 2, the height of the edge compressing rib 1e may be preferably shorter (thinner) than the outer circumference 2a.

The energy director 1d and the edge compressing rib 1e are formed in the shapes at the same time by the molding of the resin frame.

The edge 2 may be formed of a suitable material such as a cloth edge, a soft rubber edge, or a foam such as a urethane foam or a foam rubber, as appropriate.

The resin ring 3 may be preferably made of PP, ABS, PC, or a reinforced resin with GF or the like added therein, like the resin frame 1.

Figure 2:
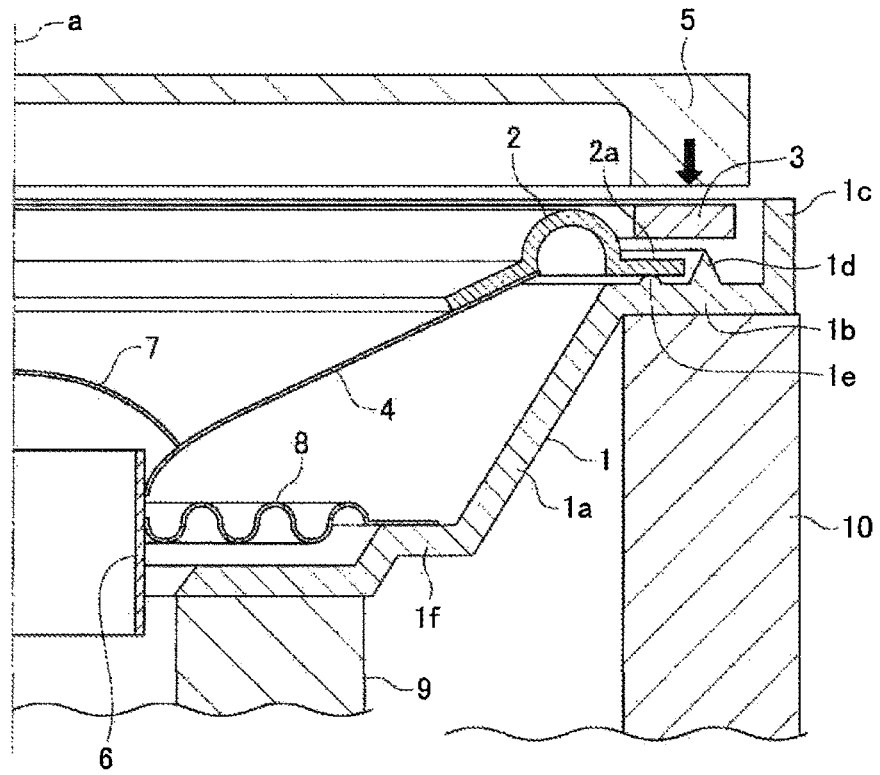
FIG. 2 is a side section view of a half of the speaker according to the first embodiment, for explaining how to manufacture the speaker.
Figure 3:
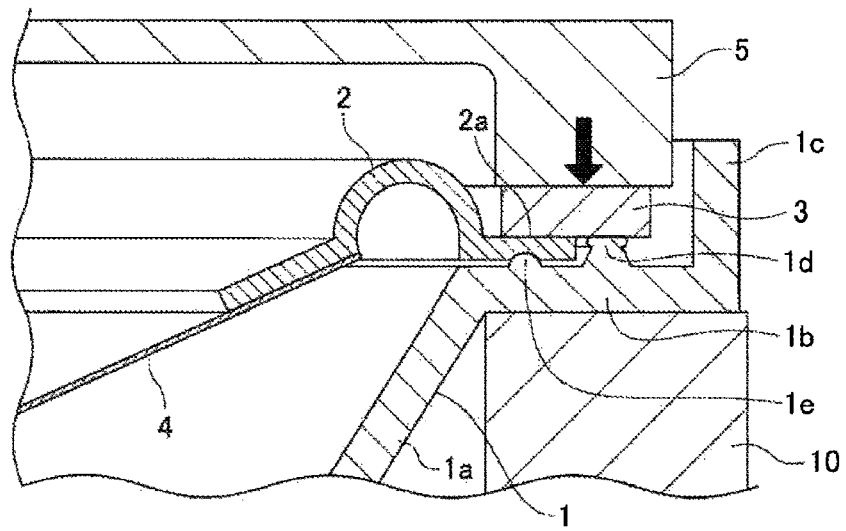
FIG. 3 illustrates a first stage of the manufacturing process of the speaker according to the first embodiment.
Figure 4:
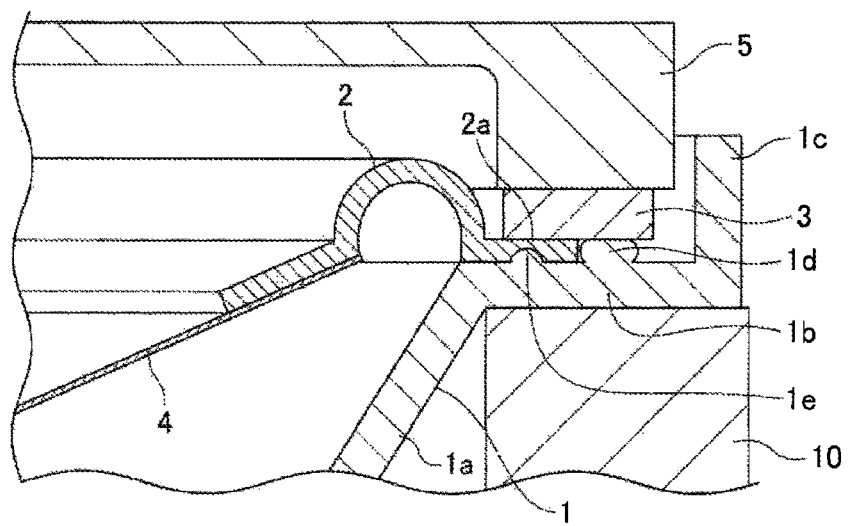
FIG. 4 illustrates a second stage of the manufacturing process according to the first embodiment.

FIGS. 2 to 4 show a manufacturing process according to this embodiment.

FIG. 2 shows the shape of the energy director 1d before being melted. The energy director 1d may preferably have a substantially triangular sideward cross-section. The energy director 1d has a tip. The tip is the distal end of the energy director. The energy director 1d has such a tapered shape, so that, when an ultrasonic horn 5 is driven (i.e., ultrasonically vibrated), the energy will concentrate at the tip, thereby facilitating quick melting of the energy director 1d from the tip. The height of the energy director 1d before melted is higher (i.e., thicker) than the sum of the thickness of the outer circumference 2a of the edge 2 and the edge compressing rib 1e, so that the energy director 1d abuts on the resin ring 3 prior to the outer circumference 2a of the edge 2. As long as being easily meltable, the tip portion may be round. The sideward cross-section is not necessarily in a substantially triangular shape but may be in any other shape that is easily meltable.

The outer circumferential end of the edge is positioned not in contact with the energy director 1d. This configuration makes the melted resin resulted from the melting of the energy director 1d difficult to flow toward the edge 2.

A space is left between the energy director 1d and the outer wall 1c of the resin frame 1, so that the ultrasonic horn 5 and the outer wall 1c of the resin frame 1 will not interfere with each other at the time of manufacturing.

In FIG. 2, the reference character a denotes the centerline indicating the half of a cross-section of the speaker. Reference numeral 6 denotes a cylindrical voice coil bobbin having an outer circumference whose front side is connected to the inner circumference of the diaphragm 4, where the front side is the side facing the sound emitting surface. Reference numeral 7 denotes a dust cap provided over a front opening of the voice coil bobbin 6. Reference numeral 8 denotes a wave-shaped damper whose inner circumference is connected to the outer circumferential surface of the voice coil bobbin 6 and whose outer circumference is fixed to a damper mount 1f of the resin frame 1. Reference numeral 9 denotes a frame mounting portion, on which a bottom of the frame 1 is fixedly mounted, the frame mounting portion 9 including an upper plate, a front surface of an outer yoke, and a front surface of a cup for housing a magnetic circuit.

For assembling, the outer circumference of the edge 2 is set on the edge mounting portion 1b of the resin frame 1, and the resin ring 3 is set thereon. In this case, the energy director serves as a positioning target. On the other hand, the inner diameter of the outer wall 1c can serve as the positioning target of the outer diameter of the resin ring 3.

After setting the resin ring 3, the back surface of the edge mounting portion 1b is firmly held on a jig 10. The ultrasonic horn 5 is placed on the front side with respect to the resin ring 3.

The ultrasonic horn 5 is moved downward as indicated by the arrow to press the resin ring 3 while being driven, so that the energy driving the ultrasonic horn 5 concentrates, via the resin ring 3, at the tip portion of the tapered energy director 1d with a substantially triangular sideward cross-section. The energy director 1d with the tip portion thereof abutting on the back surface of the resin ring 3 melts quickly from the tip.

As shown in FIG. 3, the ultrasonic horn 5 being driven is further moved downward to press the resin ring 3, thereby further melting the energy director 1d.

Accordingly, the front surface of the outer circumference 2a of the edge 2 is pressed by the back surface of the resin ring 3, thereby moving the outer circumference 2a of the edge 2 also downward, so that the outer circumference 2a is subject to pressure from and held by the edge compressing rib 1e located in back of the outer circumference 2a FIG. 4 shows that the energy director 1d has been melted and com-pressed by the ultrasonic horn 5 and the resin ring 3, the edge compressing rib 1e bites into the back surface of the outer circumference 2a of the edge 2, and the edge 2 is sandwiched and held between the resin ring 3 and the edge mounting portion 1b of the resin frame 1

In this manner, since the edge compressing rib 1e bites into the outer circumference 2a of the edge 2, the edge 2 will not be displaced. In addition, the top of the edge compressing rib 1e is round not to damage the outer circumference 2a of the edge 2.

In this case, if the resin frame 1 and the resin ring 3 are made of the same material, the resin frame 1 and the resin ring 3 can thus be reliably and firmly welded and integrated together with excellent weldability therebetween.

The resin frame 1 and the resin ring 3 are not necessarily made of the same material as long as the materials of the resin frame 1 and the resin ring 3 exhibit good weldability therebetween.

In this manner, the outer circumferential end of the edge 2 is com-pletely surrounded by the melted energy director $1_d$ over the entire circumference. The edge compressing rib 1e also extends over the entire circumference in a basic configuration, but may be intermittent at circumferential intervals. As an alternative, a plurality of edge compressing ribs 1e may be aligned inner-concentrically with respect to the energy director 1d. Optionally, edge compressing rib 1e may be a plurality of hemispherical projections aligned circumferentially.

The use of an adhesive is associated with deterioration of adhesive strength over time in a long-term usage.

The welding according to this embodiment provides a greater bonding strength than the typical adhesion using an adhesive.

A speaker attached to a door of a vehicle would be occasionally damaged by the impact of a slam of the door frequently opened and closed.

In this embodiment, the resin ring 3 and the resin frame 1 are firmly welded and integrated together by the energy director 1d. The outer circumference 2a of the edge 2 is also sandwiched between the resin ring 3 and the edge mounting portion 1b, and is reliably held via the edge compressing rib 1e.

The speaker assembled in this manner is attached to a door of a vehicle via any appropriate well-known attachment means.

When dirty, a vehicle would be washed in a car washer, for example.

In this case, a car washing liquid, such as water, car shampoo, or car wax, would enter a gap between a window glass and a rubber water stop, so as to reach where the speaker is attached.

Figure 5:
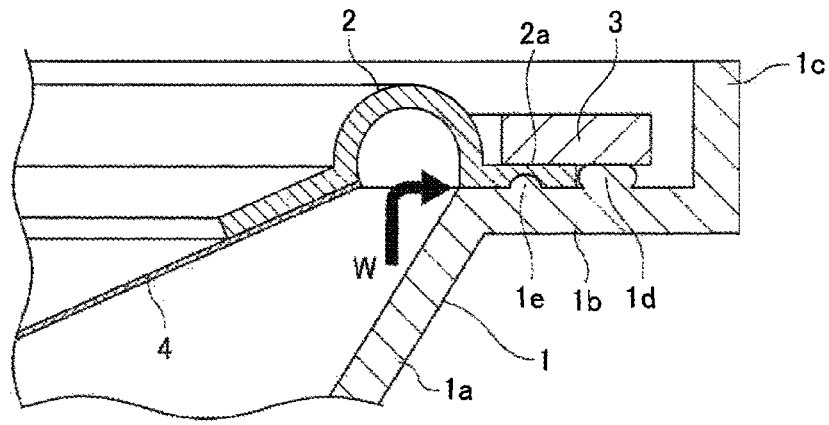
FIG. 5 is a view for explaining how to keep a liquid in the outer circumference on a back side of the speaker from invading into a front side of the speaker.

The speaker according to this embodiment is configured such that the energy director 1d thus subjected to the melting is extended over the entire circumference of the speaker and also acts as a waterproof barrier against a car washing liquid W containing a chemical agent that would otherwise enter the front side of the speaker from the back side thereof as indicated by the arrow in FIG. 5, whereby the car washing liquid will be prevented from invading into the front side of the speaker.

Figure 6:
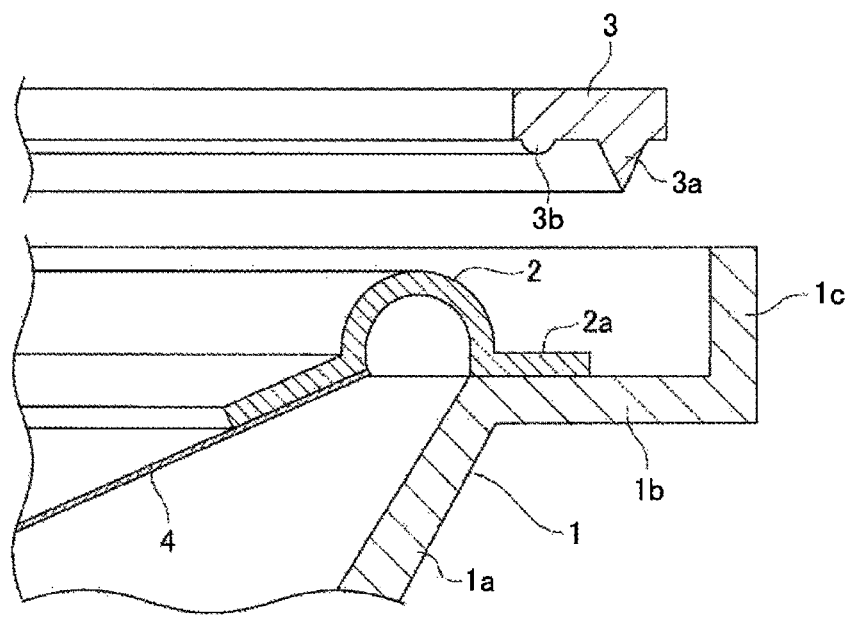
FIG. 6 is a sideward side section view of a main part according to a second embodiment of the present invention.

FIG. 6 shows a second embodiment of the present invention.

One of the features of this embodiment is as follows. The resin ring 3 includes an energy director 3a on the back surface of the outer circumference thereof, and an edge compressing rib 3b being more inner than the energy director 3a.

In assembling, the resin ring 3 is pressed from above by the ultrasonic horn 5, and the energy director 3a melts from the tip portion of the tapered shape thereof. The front surface of the outer circumference 2a of the edge 2 is pressed by the edge compressing rib 3b, and the outer circumference 2a of the edge 2 comes into contact with and joined to the front surface of the edge mounting portion 1b of the resin frame 1.

Via the energy director 3a melted and deformed in this process, the resin ring 3 and the resin frame 1 are welded and integrated together.

The second embodiment is similar to the first embodiment as to the other configurations and operations.

Note that the speakers according to these embodiments are not necessarily on-vehicle speakers but also are applicable to home speakers. Moreover, the speakers according to these embodiments are not necessarily circular speakers but also applicable to speakers in another shape, such as a rectangular speaker.

DESCRIPTION OF REFERENCE CHARACTERS a Speaker Centerline
1 Resin frame
1a Body
1b Edge Mounting Portion
1c Outer Wall
1d Energy Director
1e Edge Compressing Rib
2 Edge
3 Resin Ring
3a Energy Director
3b Edge Compressing Rib
4 Diaphragm
5 Ultrasonic Horn
6 Voice Coil Bobbin
7 Dust Cap
8 Damper
9 Resin Frame Mount
10 Jig

The invention claimed is:
1. A speaker comprising:
an edge having an outer circumference attached on an edge mounting portion of a resin frame by a resin ring provided on a front surface of the outer circumference, the edge mounting portion including an energy director having a tip portion abutting on a back surface of the resin ring and being meltable from the tip portion by ultrasonic waves, and an edge compressing rib being more inner than the energy director, the edge compressing rib being configured to press and put pressures on a back surface of the outer circumference of the edge.

2. The speaker of claim 1, wherein the edge compressing rib is distanced from the energy director.

3. A speaker comprising:

an edge having an outer circumference attached on an edge mounting portion of a resin frame by a resin ring provided on a front surface of the outer circumference, the resin ring including, on a back surface thereof, an energy director having a tip portion abutting on a front surface of the edge mounting portion and being meltable from the tip portion by ultrasonic waves, and an edge compressing rib being more inner than the energy director, the edge compressing rib being configured to press and put pressure on a front surface of the outer circumference of the edge.

4. The speaker of claim 3, wherein the edge compressing rib is distanced from the energy director.

* * * * *